(12) United States Patent
Horak et al.

(10) Patent No.: US 7,229,885 B2
(45) Date of Patent: Jun. 12, 2007

(54) FORMATION OF A DISPOSABLE SPACER TO POST DOPE A GATE CONDUCTOR

(75) Inventors: David V. Horak, Essex Junction, VT (US); Toshiharu Furukawa, Essex Junction, VT (US); Akihisa Sekiguchi, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/752,386

(22) Filed: Jan. 6, 2004

(65) Prior Publication Data

US 2005/0145958 A1    Jul. 7, 2005

(51) Int. Cl.
*H01L 21/336* (2006.01)
(52) U.S. Cl. .................. 438/305; 438/592
(58) Field of Classification Search ........... 257/288, 257/412, 413, 344, 408; 438/585, 587, 588, 438/592, 301, 303, 305, 306, 307
See application file for complete search history.

(56) References Cited

U.S. PATENT DOCUMENTS

| | | | |
|---|---|---|---|
| 5,168,072 A * | 12/1992 | Moslehi | 438/300 |
| 6,489,207 B2 | 12/2002 | Furukawa et al. | |
| 6,531,365 B2 | 3/2003 | Dokumaci et al. | |
| 6,534,351 B2 | 3/2003 | Muller et al. | |
| 2004/0124450 A1* | 7/2004 | Yeap et al. | 257/288 |

* cited by examiner

*Primary Examiner*—Steven Lake
*Assistant Examiner*—Andrew O Arena
(74) *Attorney, Agent, or Firm*—Scully, Scott, Murphy & Presser, P.C.; Todd M. C. Li, Esq.

(57) ABSTRACT

A method of forming a doped gate structure on a semiconductor device and a semiconductor structure formed in that method are provided. The method comprises the steps of providing a semiconductor device including a gate dielectric layer, and forming a gate stack on said dielectric layer. This latter step, in turn, includes the steps of forming a first gate layer on the dielectric layer, and forming a second disposable layer on top of the first gate layer. A fat spacer is formed round the first gate layer and the second disposable layer. The second disposable layer is removed, and ions are implanted in the first gate layer to supply additional dopant into the gate above the gate dielectric layer, while the fat disposable spacer keeps the implanted ions away from the critical source and drain diffusion regions.

4 Claims, 6 Drawing Sheets

1. Silicide formation (CoSi2 or NiSi)
2. Device passivation insulator formation
   - CVD or PECVD of nitride and BPSG (Boronphosphrous Silicate) and planarization
3. Contact (W stud) and metal (Cu or Al) wiring formatoin

US 7,229,885 B2

FORMATION OF A DISPOSABLE SPACER TO POST DOPE A GATE CONDUCTOR

BACKGROUND OF THE INVENTION

1. Field of the Invention

This invention generally relates to semiconductor device manufacturing, and more particularly, the invention relates to a method of fabricating semiconductor devices having a reduced carrier-depletion effect of polysilicon (polySi) gate conductor. Even more specifically, the invention relates to the use of a fat disposable spacer, in such fabrication methods, to facilitate post-doping of the polySi gate conductor without disturbing the optimum source and drain doping profile for a high performance metal oxide semiconductor filed effect transistor (MOSFET).

2. Background Art

With decreasing gate lengths in metal oxide semiconductor field effect transistors (MOSFETs), the effective gate dielectric thicknesses (Tinv) of the order of 2 nm or less are required to improve short-channel behavior and to increase the on-current without increasing the off-current. The contribution of carrier-depletion effect of the polySi gate conductor at the gate dielectric interface, the so called "polySi depletion effect," to the effective gate dielectric thickness becomes significantly large when the Tinv is of the order of 2 nm or less. It has been recognized that it is important to dope the polySi gate heavily, particularly near the gate dielectric interface, to reduce the polySi depletion effect. However, with the conventional manufacturing process, where the gate polySi and S/D diffusion are implanted at the same time, it is not possible to dope the polySi gate in such a way to minimize the polySi depletion effect without compromising the optimum source and drain (S/D) diffusion doping profile, because the polySi and S/D diffusion are doped by the same ion implantations. It is desirable to decouple the PolySi and S/D implantation so that they can be optimized separately.

One method to decouple the gate and S/D implant is known as "pre-doping" of PolySi. The polySi is implanted prior to PolySi etching to define the gate conductor to boost polySi-doping levels. The disadvantage of this method is that the PFET and NFET areas are doped using different species (e.g., boron and arsenic) which can cause these areas to etch differently during the PolySi etch. This is a serious concern for device length control of both NFET and PFET.

Another method to decouple the gate that has been used is known as post-doping with "anti-spacer." It is called post-doping because the additional doping to the gate is made after the gate PolySi etching to avoid the problems associated with etching of the dual doped PolySi. With the post-doping method with anti-spacer, a planarizing polymer layer such as an anti-reflective coating material (ARC) is spun onto the wafer after the PolySi has been etched. The ARC fills areas between the PolySi lines, which blocks the implant from going into the Si S/D regions while thin enough ARC is left on top of the PolySi. However, the most serious drawback of this technique is that enough ARC material actually stays on top of the PolySi of either a wide PolySi line or dense multiple PolySi lines, which blocks the implant from going into the PolySi, where it is needed.

SUMMARY OF THE INVENTION

An object of this invention is to fabricate a semiconductor device having a reduced carrier-depletion effect of a polysilicon (polySi) gate conductor.

Another object of the invention is to use a fat disposable spacer, in a semiconductor fabrication process, to facilitate post-doping of the polySi gate conductor without disturbing the optimum source and drain doping profile for a high performance metal oxide semiconductor field effect transistor (MOSFET).

These and other objectives are attained with a method of forming a doped gate structure on a semiconductor device, and a semiconductor structure formed in that method. The method comprises the steps of providing a semiconductor device including a gate dielectric layer, and forming a gate stack on said dielectric layer. This latter step, in turn, includes the steps of forming a first gate layer on the dielectric layer, and forming a second layer on top of the first gate layer. A disposable spacer is formed around the first and second gate layers. The increased stack height by addition of the second layer enables to form a wide disposable spacer. The second layer is removed, and ions are implanted in the first gate layer to supply additional dopant to the polySi gate above the gate dielectric layer. The wide disposable spacer keeps the implant away from the critical regions of S/D diffusion.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
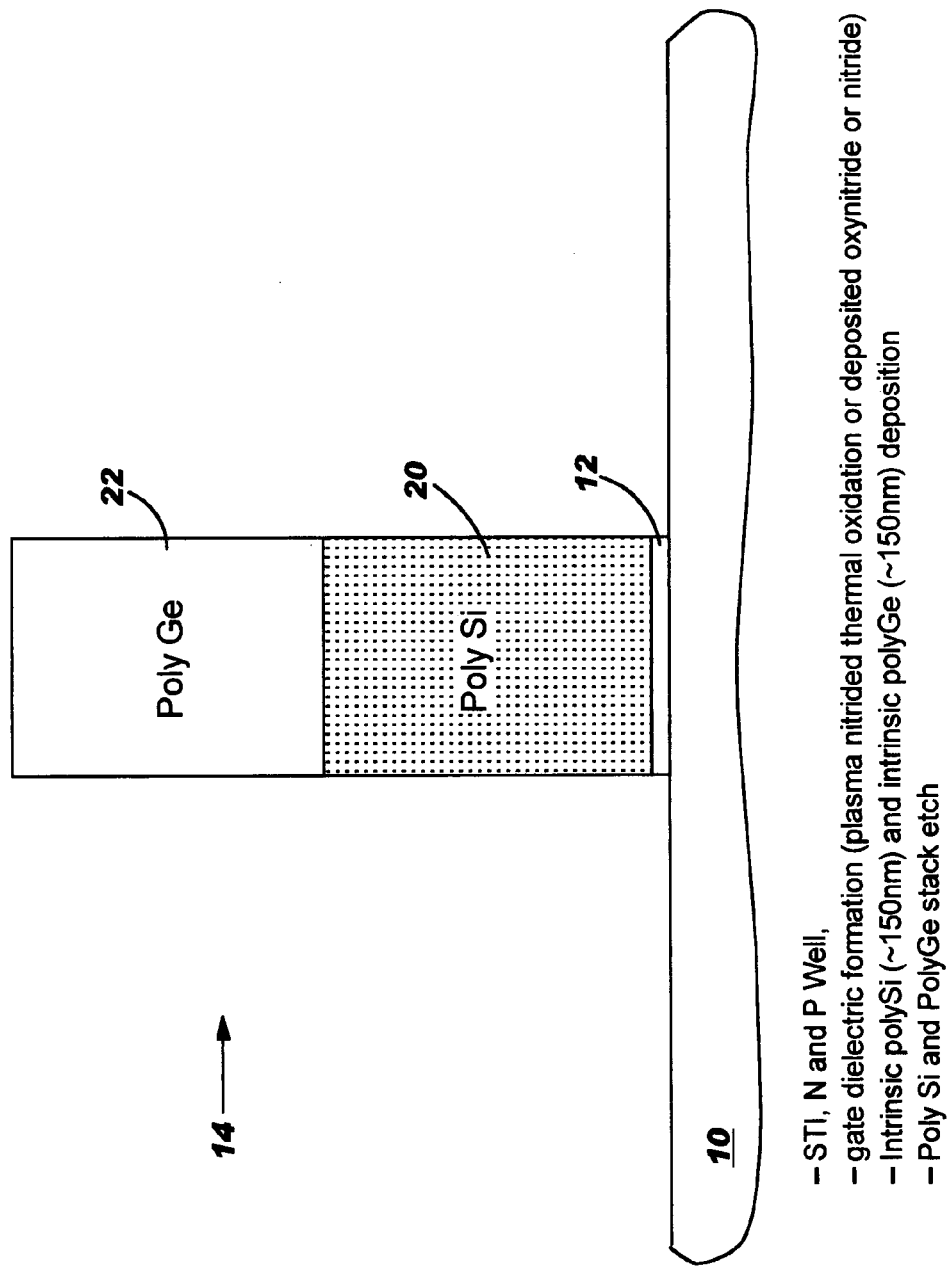
FIG. 1 shows portions of a semiconductor wafer with a poly Si gate and disposable poly Ge stack.

The present invention, which provides a method of fabricating a MOSFET device in which additional doping of the polySi gate without disturbing the critical region of the source/drain regions of the extensions is achieved, will now be described in greater detail by referring to the drawings that accompany the present application. It is noted that in the accompanying drawings, like and/or corresponding elements are referred to by like reference numerals.

Reference is first made to FIG. 1 which illustrates portions of an initial structure that may be employed in the present invention. Specifically, the initial structure shown in FIG. 1 comprises semiconductor substrate 10, a layer of gate dielectric 12 formed on a surface of semiconductor substrate 10, and a patterned gate stack 14 formed on portions of gate dielectric 12. It should be noted that preferably a multitude of stacks 14 are formed on dielectric 12, however for the sake of simplicity, only one stack is shown in the drawings.

The structure shown in FIG. 1 is comprised of conventional materials well know in the art and it is fabricated utilizing processing steps that are also well known in the art. For example, semiconductor substrate 10 comprises any semiconducting material including, but not limited to: Si, Ge, SiGe, GaAs, InAs, InP and all other III/V semiconductor compounds. Semiconductor substrate 10 may also include a layered substrate comprising the same or different semiconducting materials, e.g., Si/Si or Si/SiGe, as well as a silicon-on-insulator (SOI) substrate. The substrate may be of the n- or p-type depending on the desired device to be fabricated.

Additionally, semiconductor substrate 10 may contain active device regions, wiring regions, isolation regions or other like regions that are typically present in MOSFET-containing devices. For clarity, these regions are not shown in the drawings, but are nevertheless meant to be included within substrate 10. In one highly preferred embodiment of the present invention, semiconductor substrate 10 is comprised of Si.

Next, a layer of gate dielectric material 12 such as a silicon oxide, silicon nitride, silicon oxynitride, high k material such as $Al_2O_3$, $HfO_2$, $ZrO_2$, or any combination and multilayers thereof, is then formed on a surface of semiconductor substrate 10 utilizing a conventional process well known in the art. For example, the layer of gate dielectric material may be formed by a thermal growing process such as oxidation, nitridation or oxynitridation or, alternatively, by utilizing a chemical vapor deposition (CVD), plasma-assisted CVD, evaporation or chemical solution deposition.

The thickness of the layer of the gate dielectric material formed at this point of the present invention is not critical to the present invention, but typically, gate dielectric 12 has a thickness of from about 1 to about 20 nm after deposition, with a thickness of from about one to about three nm being more highly preferred. It is noted that the gate dielectric material employed in the present invention may be a conventional dielectric material such as $SiO_2$ or $Si_3N_4$, $SiO_xN_y$, or alternatively, high-k dielectrics such as oxides of Ta, Zr, Hf, Al or combinations thereof may be employed. In one highly preferred embodiment of the present invention, gate dielectric 12 is comprised of an oxide such as $SiO_2$, or oxynitride $SiO_xN_y$, $Al_2O_3$ (aluminum oxide)or $HfSi_xO_y$, (hafnium silicate).

After forming gate dielectric 12 on a surface of semiconductor substrate 10, a plurality of gate stacks 14 are formed atop the layer of gate dielectric. As shown in FIG. 1, each gate stack is comprised of two layers 20 and 22, one on top of the other. Preferably, the first layer 20 is comprised of intrinsic polycrystalline or so called poly silicon, and the second layer 22 is comprised of polycrystalline or so called poly germanium. Also, for example, each layer may be about 50 to 150 nm in height. The thicker the polySi layer, the more difficult it is to heavily dope the polySi near the gate dielectric 12 without degrading the S/D diffusion profile, since the higher energy implantation is required to heavily dope the polySi near the gate dielectric. The gate stack 14 is positioned by using conventional lithography and etching steps. The photoresist used is stripped after the etch to form the gate stack structure shown in FIG. 1.

The term "gate material" as used herein denotes a conductive material, a material that can be made conductive via a subsequent process such as ion implantation, or any combination thereof. Illustrative examples of suitable gate materials that can be employed in the present invention include, but are not limited to: polysilicon, amorphous silicon or polysilicon germanium.

The gate material is formed on the surface of gate dielectric 12 utilizing conventional deposition processes well known in the art including, but not limited to: CVD, or plasma-assisted CVD.

Figure 2:
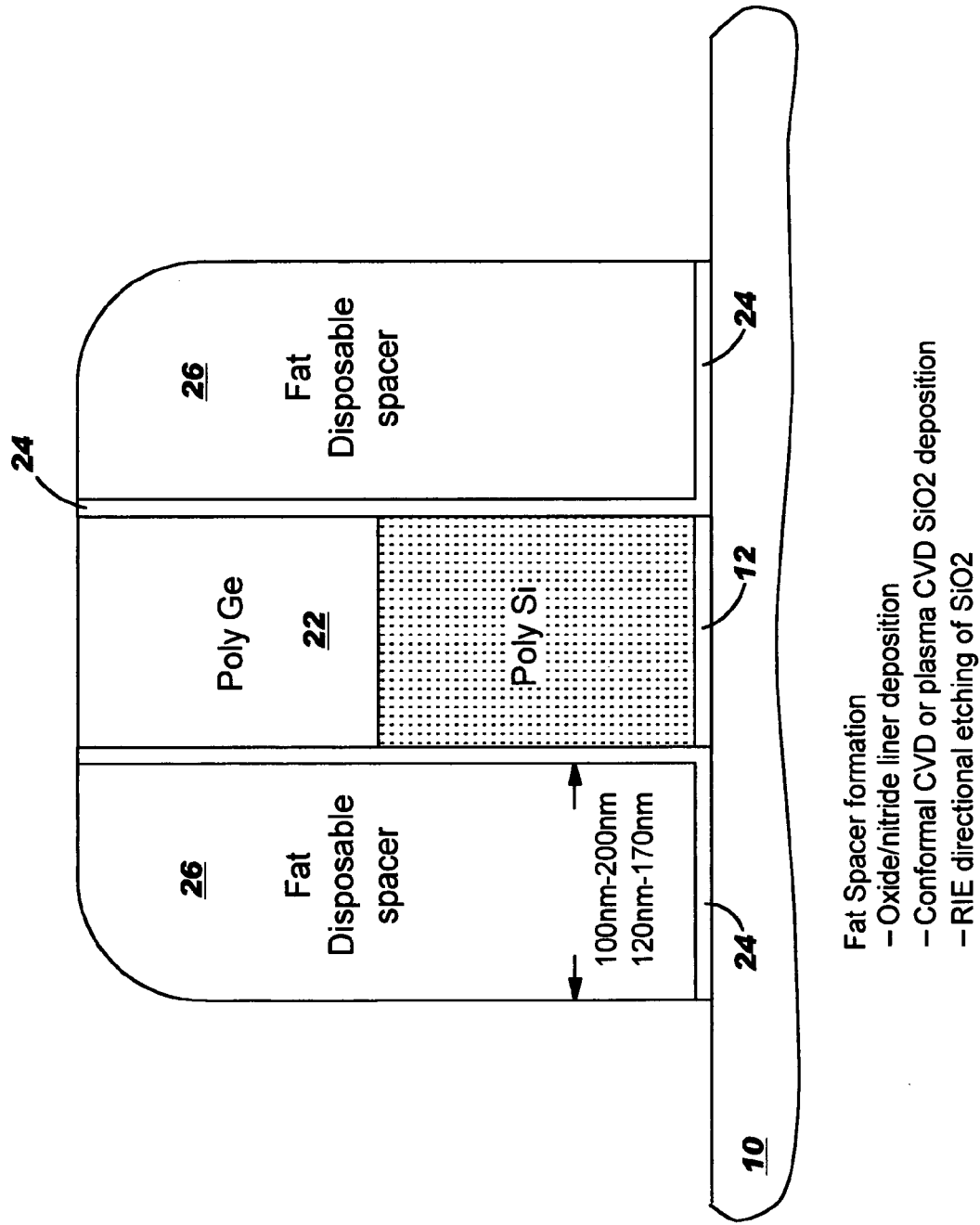
FIG. 2 shows a disposable spacer around the poly Si gate and disposable Poly Ge stack.

With reference to FIG. 2, after gate stack 14 is formed, an oxide/nitride line 24 is deposited on the stack and on the semiconductor substrate 10 immediately around the gate stack. After this, an oxide, disposable space 26 is formed around the gate stack 14 by conformally depositing the oxide and directionally etching the oxide by reactive ion etching (RIE). The RIE removes the liner 24 and spacer 26 from the top of the gate stack 14 and the exposed Si substrate area. The disposable layer 22, of at least the same thickness as, or thicker than, that of polySi layer 20, was added and the at least 2× fatter space 26 was formed so that the deep polySi doping implantation (discussed below) is kept away from the critical region of S/D diffusion near the extension.

Figure 3:
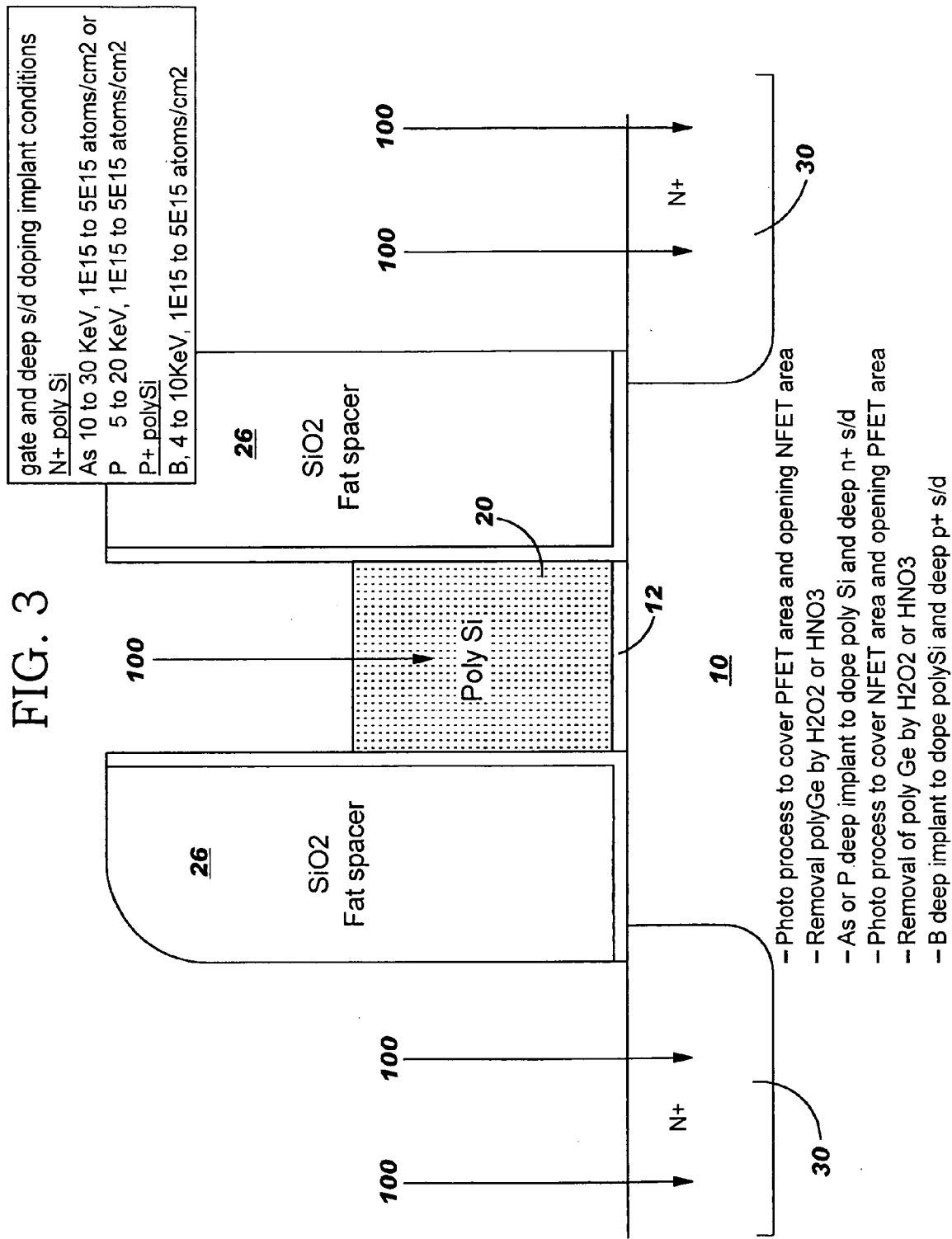
FIG. 3 illustrates an ion implantation process applied to the semiconductor wafer.

With reference to FIGS. 2 and 3, the disposable poly Ge layer 22 is removed from gate stack 14; and this may be done, for example, by a $H_2O_2$ or $HNO_3$ etching process, while the PFET area is covered by a photo resist. After the poly Ge layer is removed, an As or P deep ion implantation process 100 is employed to dope the N+ polySi layer 20. The implant goes into the substrate 10, forming extension regions 30, but it is kept sufficiently away from the active device area by the fat spacer 26.

Figure 4:
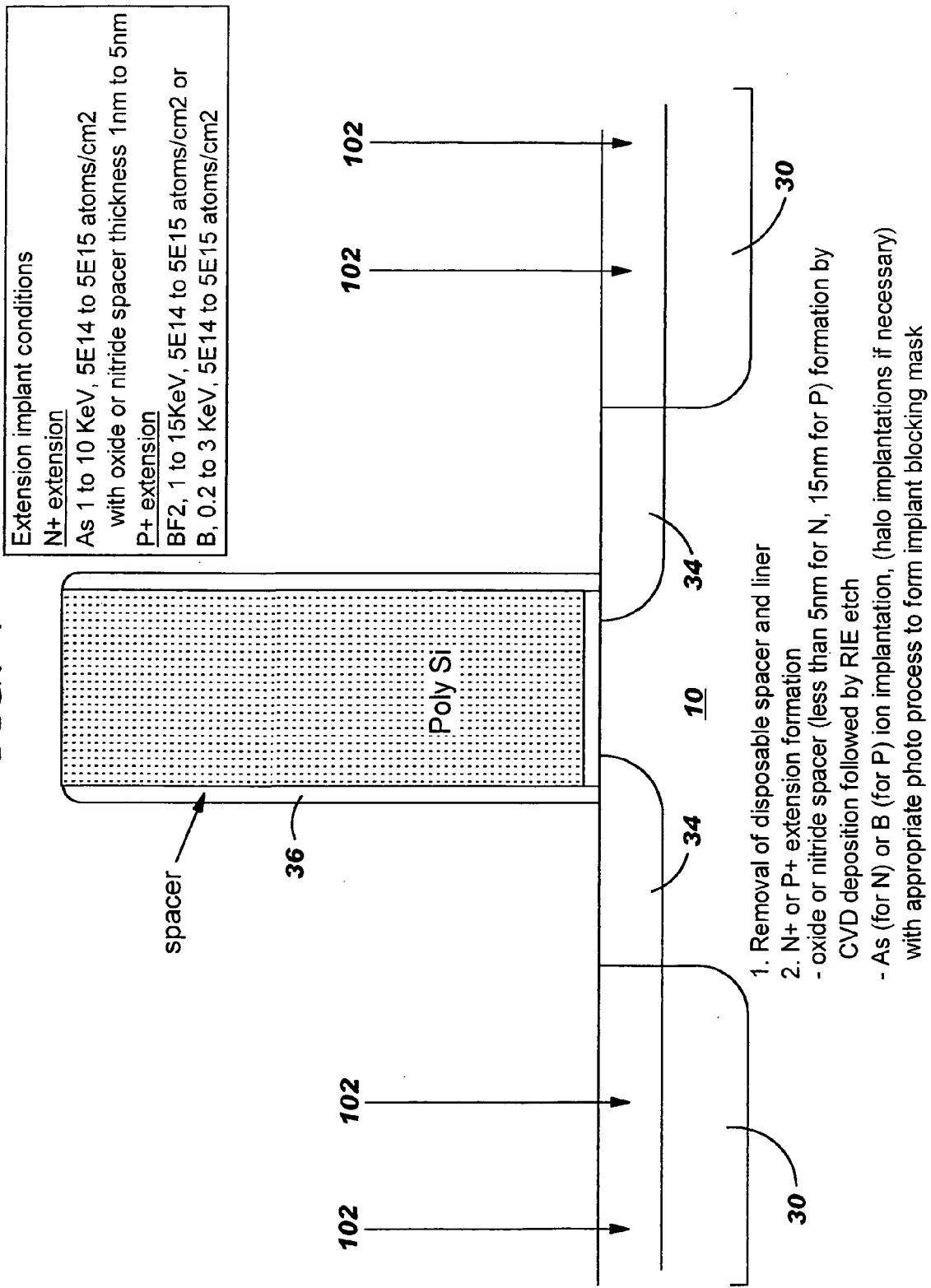
FIGS. 4 and 5 illustrate further ion implantation processes applied to the semiconductor wafer.

With reference to FIGS. 3 and 4, after the deep implant 100 to dope the poly Si layer, spacer 26 and the liner 24 may be removed and second n+ and p+ extensions 34 are formed by ion implantation 102 with using blocking photoresist mask (not shown in the figure) and spacers 36. This second spacer 36 may be formed using any suitable procedure, and, for instance, the spacer may be formed using a CVD oxide deposition and directional etch process.

Figure 5:
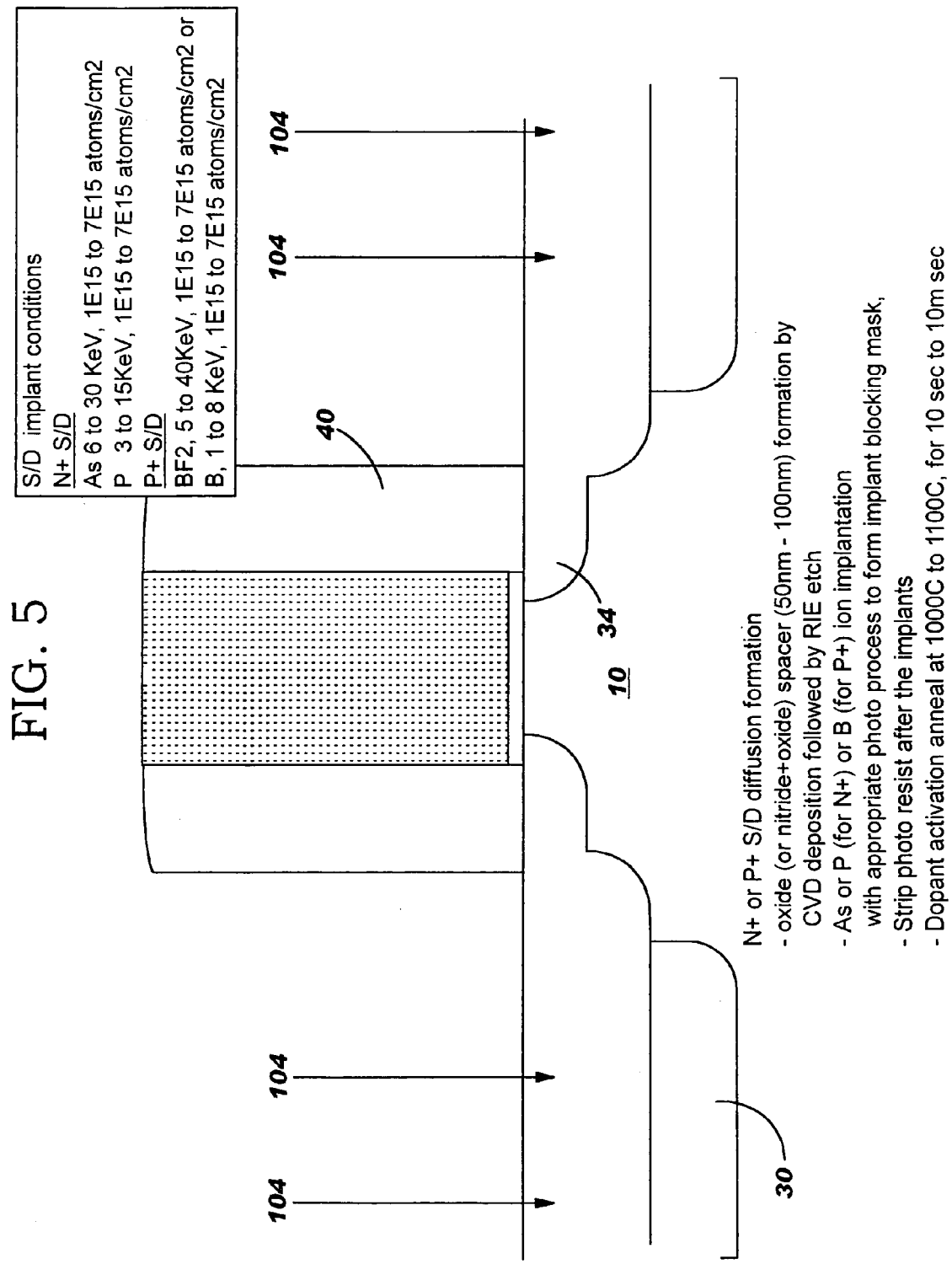

With reference to FIG. 5, after the n+ and p+ extension implantation, n+ and p+ source/drain diffusion regions 30 are doped by ion implantation 104 with the third spacer 40 formed over spacer 36 and with using blocking photoresist mask (not shown in the Figure).

Figure 6:
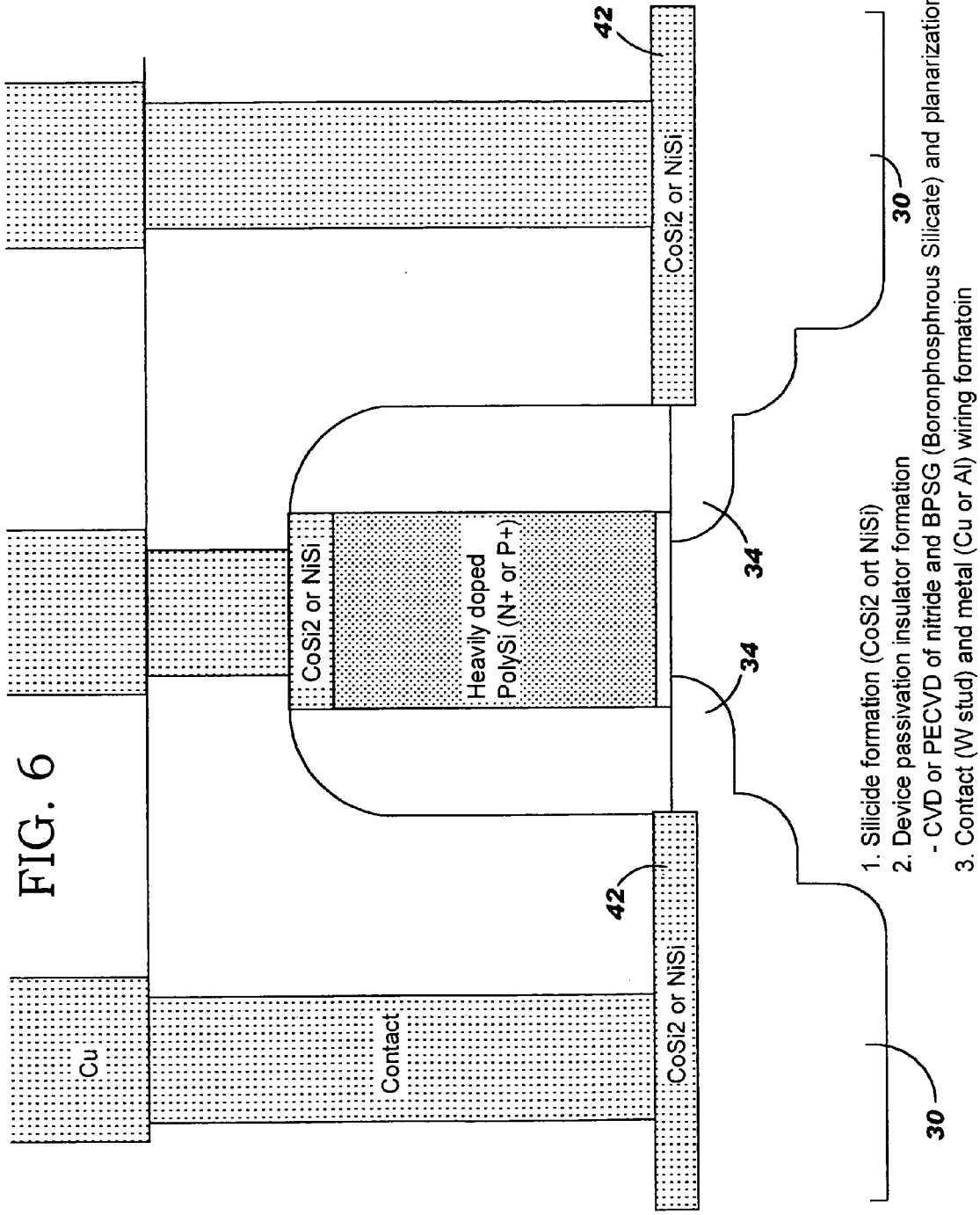
FIG. 6 shows the semiconductor wafer after further processing.

Further processing steps may then be used to complete the fabrication of the semiconductor device. With reference to FIG. 6, $CoSi_2$ or NiSi layer 42 may be formed on top of the semiconductor substrate 10 and the top of PolySi gate conductor. Conventional semiconductor fabrication techniques may be used to form silicide layer 42. Passivation insulator is formed over the device, and then contacts and metal wiring are formed to make working CMOS circuits.

The process described here is one of the preferred embodiments and the process sequence may be varied to achieve the same results. For example, the S/D extension implantations can be made right after the deposition of the liner layer 24 as a spacer before the formation of the fat disposable spacer 26. Also, hollow implantations, which are not an essential part of the present invention, may be made at the same process step as the extension ion implantations.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of fabricating a semiconductor device, comprising the steps:

providing a semiconductor substrate;
   forming a gate dielectric layer on the substrate;
   forming a gate stack on said dielectric layer, including the steps of
      i)forming a first gate layer on the dielectric layer, and
      ii)forming a second gate layer on the first gate layer;
   forming a first spacer around the gate stack;
   removing the second gate layer, implanting ions in the first gate layer to form a doped gate above the gate dielectric layer;

after the step of implanting ions in the first gate layer, removing the first spacer, forming a second spacer, thinner than the first spacer, around the first gate layer, and implanting further ions in the semiconductor device, around the second spacer, to form doped source and drain extension regions in the semiconductor device.

2. A method according to claim 1, wherein each of the first gate layer and second gate layer has a height of about 150 nm.

3. A method according to claim 1, wherein the first gate layer is comprised of polysilicon.

4. A method according to claim 1, wherein the first spacer is comprised of silicon oxide.

* * * * *